(12) United States Patent
Hsiao et al.

(10) Patent No.: US 11,449,275 B2
(45) Date of Patent: Sep. 20, 2022

(54) METHOD AND SYSTEM FOR BINARY SEARCH

(71) Applicant: Core Keepers Investment Inc.

(72) Inventors: Yi-Lung Hsiao, Taipei (TW);
Chih-Liang Chou, Taipei (TW)

(73) Assignee: OPTICORE TECHNOLOGIES INC. (US), Irvine, CA (US)

( * ) Notice: Subject to any disclaimer, the term of this patent is extended or adjusted under 35 U.S.C. 154(b) by 0 days.

(21) Appl. No.: 17/380,010

(22) Filed: Jul. 20, 2021

(65) Prior Publication Data

US 2022/0019373 A1 Jan. 20, 2022

Related U.S. Application Data

(60) Provisional application No. 63/053,727, filed on Jul. 20, 2020.

(51) Int. Cl.
*G06F 3/06* (2006.01)
(52) U.S. Cl.
CPC .......... *G06F 3/0655* (2013.01); *G06F 3/0604* (2013.01); *G06F 3/0673* (2013.01)

(58) Field of Classification Search
CPC .... G06F 3/0655; G06F 3/0604; G06F 3/0673; G06F 16/90348; G06F 12/02; G11C 8/06; G11C 8/18; G11C 7/1006
See application file for complete search history.

(56) References Cited

U.S. PATENT DOCUMENTS

| | | | | |
|---|---|---|---|---|
| 3,611,316 A | * | 10/1971 | Woodrum | G06F 16/902 |
| 2018/0173631 A1 | * | 6/2018 | Sartorius | G06F 12/0862 |
| 2020/0159915 A1 | * | 5/2020 | Klonowski | G06F 21/554 |

* cited by examiner

*Primary Examiner* — Zhuo H Li
(74) *Attorney, Agent, or Firm* — OPES IP Consulting Co. Ltd.

(57) ABSTRACT

The present invention provides a method and system for binary search. The method comprises providing a memory device with M entries, each entry storing a value; providing an index register including N register blocks, wherein the N register blocks partition the memory device into N−1, N or N+1 search areas; wherein M and N are integers and N<M; wherein when a target value is being searched in the memory device, the target value is determined to be fall between two adjacent register blocks, and only the addresses of the memory device in between the two register blocks are left for search.

10 Claims, 6 Drawing Sheets

METHOD AND SYSTEM FOR BINARY SEARCH

CROSS REFERENCE TO RELATED APPLICATION

The present application claims priority to U.S. Provisional Application Ser. No. 63/053,727, filed on Jul. 20, 2020, which are hereby incorporated by reference in their entirety.

FIELD

The present invention relates to a method and system for binary search and, more particular, to a method and system for scalable hardware binary search design with constant maximum response time.

BACKGROUND

Binary search, also known as half-interval search, logarithmic search or binary chop, is a search algorithm that finds the position of a target value within a sorted array. Binary search compares the target value to the middle element of the array. If they are not equal, the half in which the target cannot lie is eliminated and the search continues on the remaining half, again taking the middle element to compare to the target value, and repeating this until the target value is found. If the search ends with the remaining half being empty, the target is not in the array.

Reference is made to FIG. 1A and FIG. 1B, which illustrate a traditional binary search.

As can be seen on FIG. A, a binary search table is stored in a memory, and a binary search is about to be performed. The memory includes several addresses, from #0, #1 to #15. Each address stores a value. For example, #0 stores value 3, #4 stores value 20, and #13 stores value 87. A search query is now requested. The search query requests to search if value 75 exists in the memory.

Referring to FIG. 1A, traditional binary search method performs step 1 firstly, which includes the following sub-steps: (1) read the value stored in memory address #7; (2) value 47 found in #7, and it is determined that 47<75; and (3) it is then determined that no need to search #0~#6, since values are stored in order, as shown in FIG. 1A.

Traditional binary search proceed to step 2, which also includes the following sub-steps: (1) read the value stored in memory address #11; (2) value 72 found in #11, and it is determined that 72<75; and (3) it is then determined that no deed to search #8~#10, since values are stored in order.

Referring to FIG. 1B for step 3 of traditional binary search method, step 3 also perform the following sub-steps: (1) read the value stored in memory address #13; (2) value 87 found in #13, and it is determined that 87>75; and (3) it is then determined that no need to search #14~#15, since values are stored in order.

Traditional binary search finally proceed to step 4, which also includes the following sub-steps: (1) read the value stored in memory address #12; (2) value 80 is found to be stored in memory address #12; and (3) a conclusion can be made, that 75 does not exist in the memory.

Therefore, for traditional hardware binary search design, there exists certain disadvantages, for example, table entry sorting and insertion by hardware requires complex logic circuit design and more execution time. Further, for a table with M entries, the maximum response time of binary search is $\log_2 M$. Moreover, larger table size leads to larger maximum response time.

Still further, for another traditional binary CAM, it provides lower search time but requires larger circuit area that leads to higher cost.

SUMMARY OF THE DISCLOSURE

This invention relates to a method for scalable hardware binary search and, more particular, to a method scalable hardware binary search design with constant maximum response time.

According to the present invention, the method as provided comprises providing a memory device with M entries, each entry storing a value; providing an index register including N register blocks, wherein the N register blocks partition the memory device into N−1, N or N+1 search areas; wherein M and N are integers and N<M; wherein when a target value is being searched in the memory device, the target value is determined to be fall between two adjacent register blocks, and only the addresses of the memory device in between the two register blocks are left for search.

Preferably, the register blocks are extracted from the M entries of the memory device.

Preferably, the values stored in the memory device are sorted in order from small to large.

Preferably, the values stored in the memory device are sorted in order from large to small.

Preferably, the sorting is performed by a software.

This invention relates to a system for scalable hardware binary search and, more particular, to a system scalable hardware binary search design with constant maximum response time.

According to the present invention, the system as provided comprises a memory device, the memory device includes M entries, and each entry stores a value; and an index register, the index register includes N register blocks, and the N register blocks partition the memory device into N−1, N or N+1 search areas; wherein M and N are integers and N<M; wherein when a target value is being searched in the memory, the target value is determined to be fall between two adjacent register blocks, and only the addresses of the memory in between the two register blocks are left for search.

Preferably, the register blocks are extracted from the M entries of the memory device.

Preferably, the values stored in the memory device are sorted in order from small to large.

Preferably, the values stored in the memory device are sorted in order from large to small.

Preferably, the sorting is performed by a software.

DETAILED DESCRIPTION

Unless defined otherwise, all technical and scientific terms used herein have the same meanings as commonly understood by one of skill in the art to which this disclosure belongs. It will be further understood that terms; such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1A:
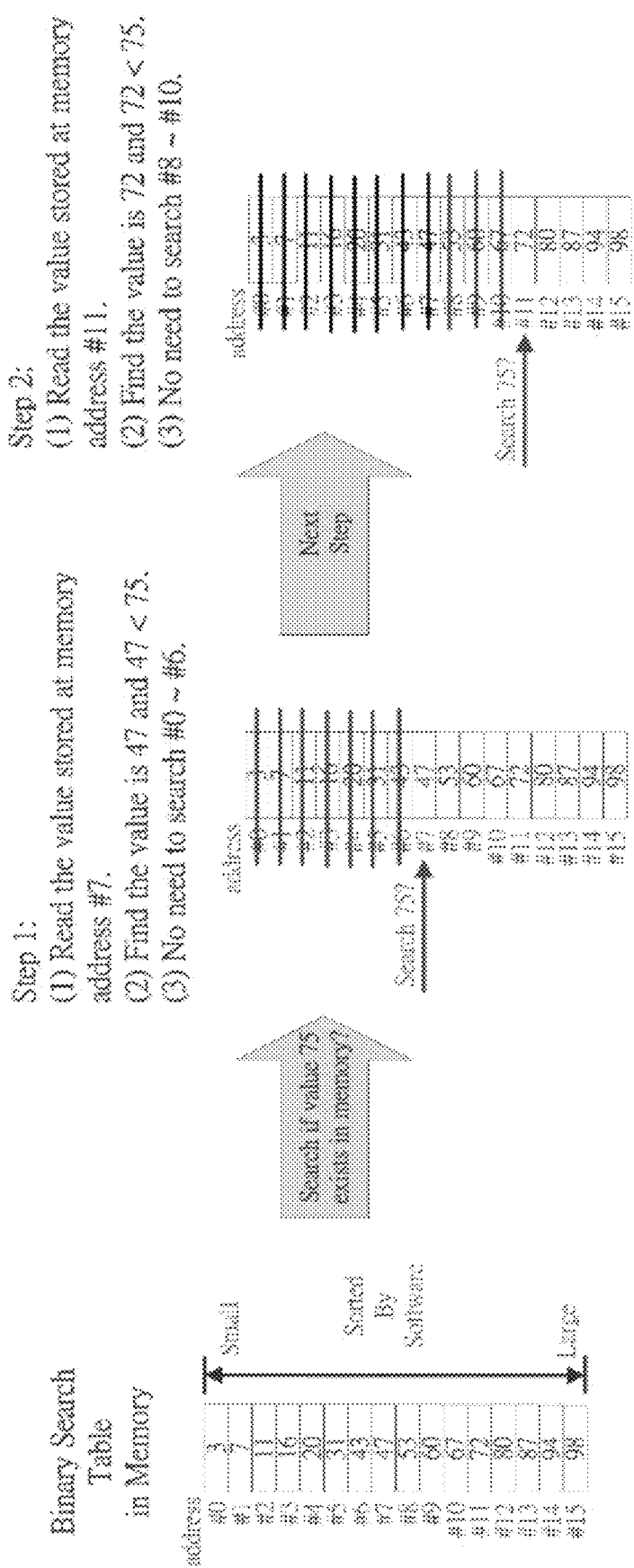
FIGS. 1A-1B illustrate a traditional binary search.
Figure 1B:
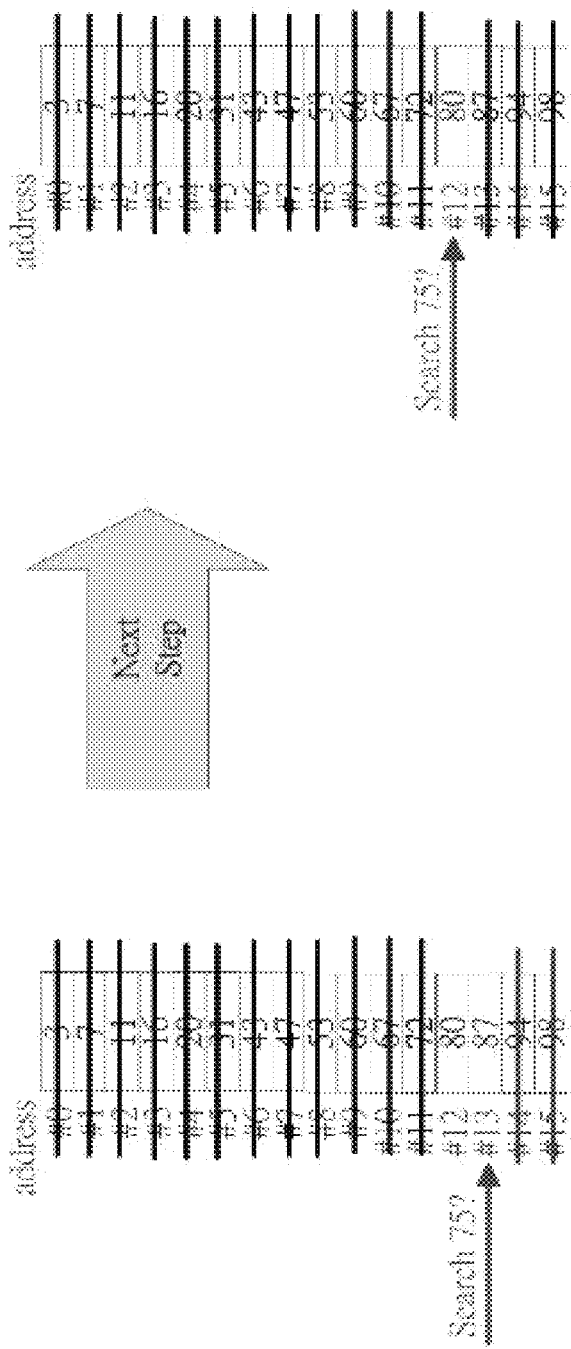
Figure 2A:
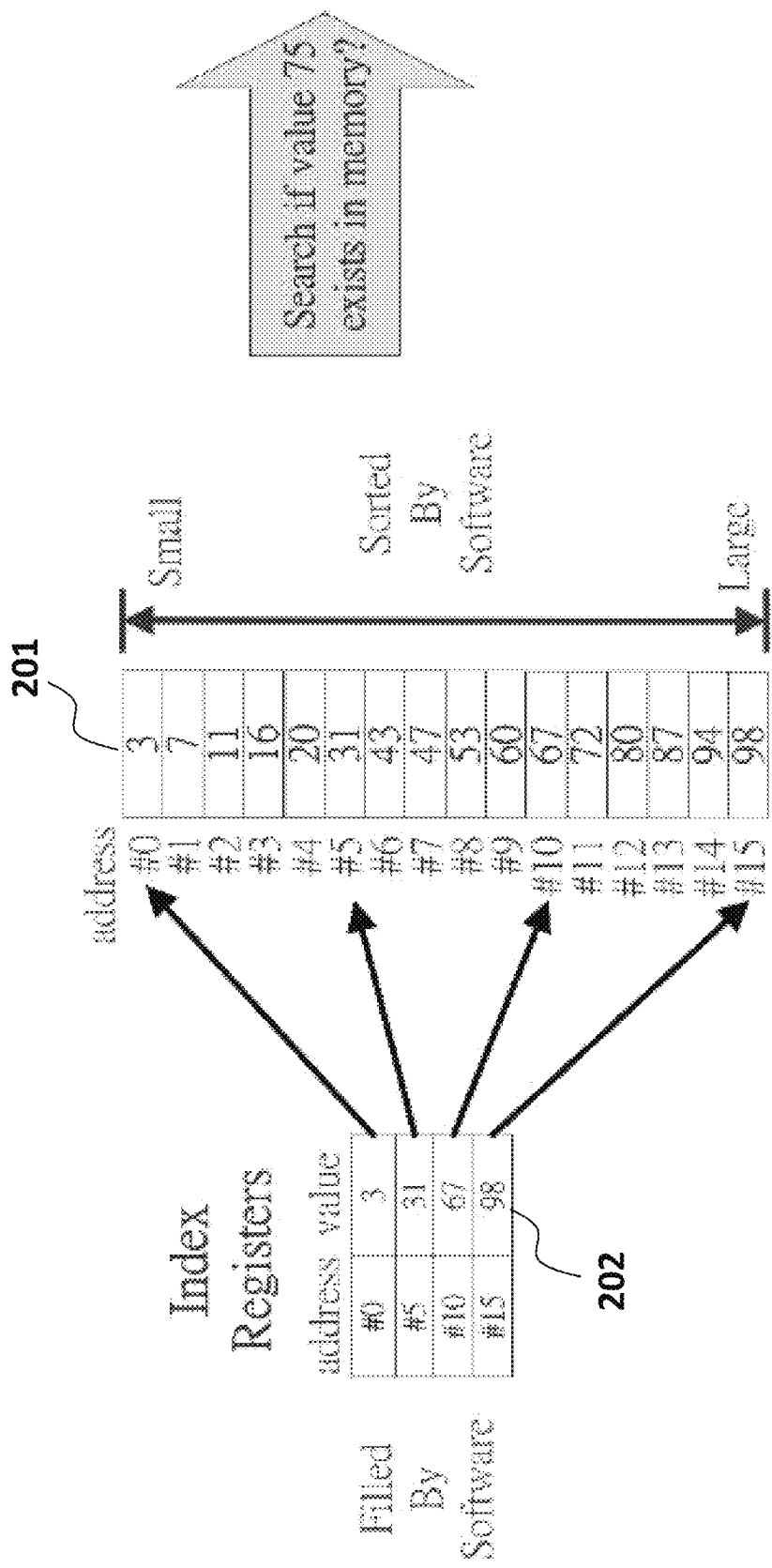
FIGS. 2A-2C illustrate the improved binary search method of the present invention.
Figure 2B:
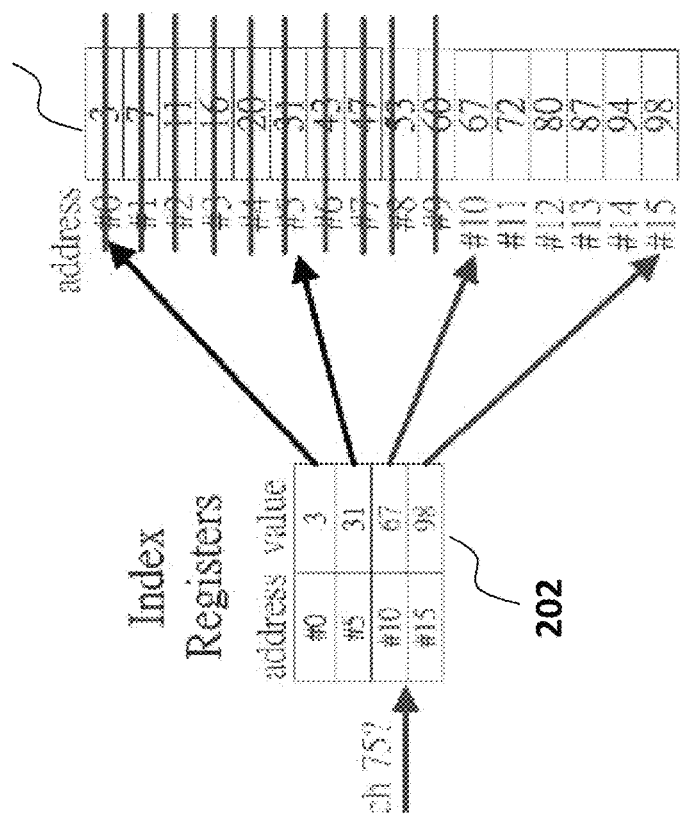
Figure 2C:
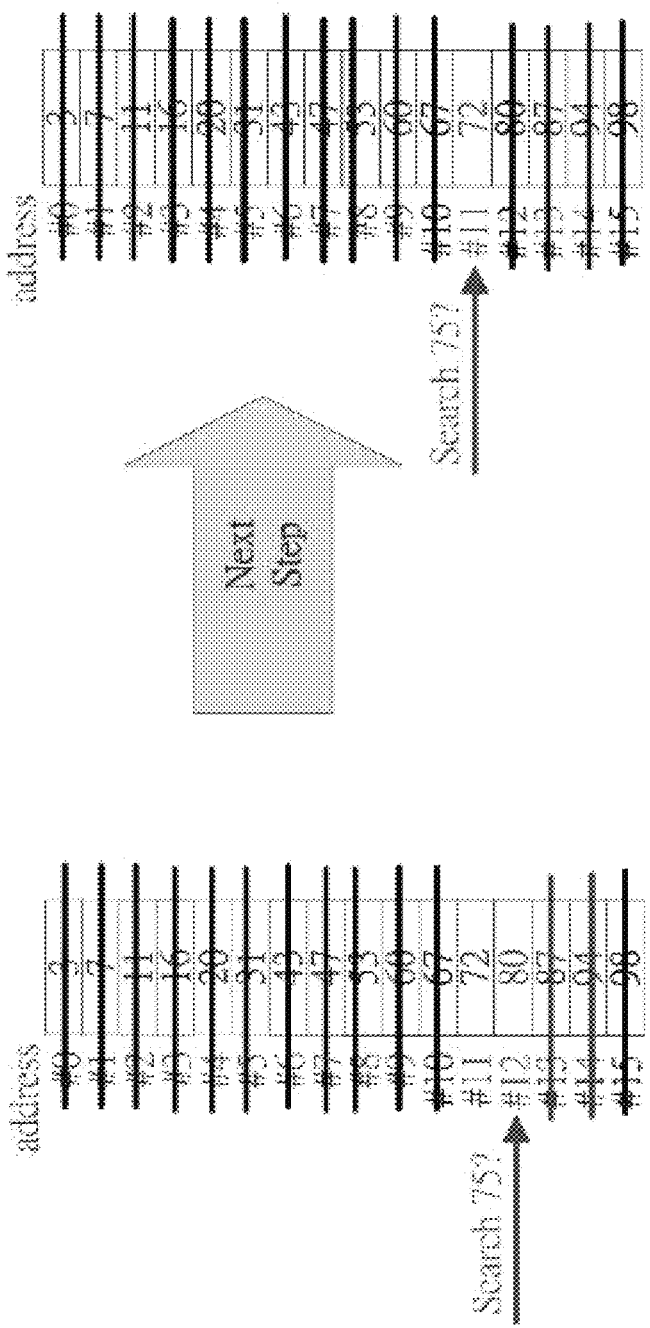

Reference is made to FIGS. 2A-2C, which are drawings illustrating the improved binary search method of the present invention. Further, the present invention can further be understood as an improved binary search with an extra binary search table in a memory and a register.

As shown in FIG. 2A, multiple values are stored in a memory 201. The memory 201 includes 16 addresses, numbered from #0 to #15. However, the number of addresses in a memory is not limited. People with ordinary skill in the art can apply the disclosure of the present invention to other memory with more addresses.

Referring back to FIG. 2A, each address of the memory 201 stores a value. For example, address #0 stores value 3, address #6 stores value 43, and address #14 stores value 94. The value as described and as illustrated in the figure are only for exemplary purpose, and should not limit the scope of the present invention.

Each value is stored in an order from small to large. The sorting may be performed by a software when these values come into memory 201. However, the sorting method is well-known to people with ordinary skill in the art, and relevant descriptions will be omitted accordingly.

The sorting may be modified accordingly. That is to say, each value may be sorted in order from large to small, and the present invention can still apply.

Further as shown in FIG. 2A, an index register 202 is further provided. The index register 202 includes four address, namely #0, #5, #10 and #15. For each address, value 3, value 31, value 67 and value 98 are each stored in address #0, #5, #10 and #15 respectively. Next, a request comes in. the request asks if value 75 exist in memory 201. The index register 202 can be in any form. That is to say, the index register 202 may be implemented as a software or a hardware.

Reference is next made to FIG. 2B, which further illustrates step 1 after the request comes in. For step 1, according to the information recorded in the index register 202, it can be found that 75 is greater than 67 and smaller than 98. Namely, 67<75<98. Therefore, addresses #0 to #9 as well as address #10 and address #15 can be ruled out from searching, since the target value 75 falls between 67 (stored in #10) and 98 (stored in #15), leaving the search to be performed from address #11 to address #14. As can be seen from FIG. such index register 202 help cut off more than half of the addresses.

Reference is next made to FIG. 2C, which illustrates step 2 and step 3. In step 2, the value stored in address #12 is read. It is found that value 80 is stored in address #80. Since value 80 is greater than the target value 75, and with the premise that each stored value is arranged in order, it can be soon found out that there's no need to search address #13 to address #14, because the values stored in the two addresses must be greater than value 75.

The present invention further proceed to step 3. The value stored in memory address #11 is next read. It is then found that the value stored in address #11 is 72. Such value 72 is the last value that has not been ruled out so far. However, since 72 is not equal to 75, it can be then concluded that value 75 does not exist in memory 201.

Referring back to step 2 of FIG. 2C, one with ordinary skill in the art may adjust accordingly to read the value stored in other address (e.g., instead of reading value in #12, value stored in 13 can be read).

Figure 3:
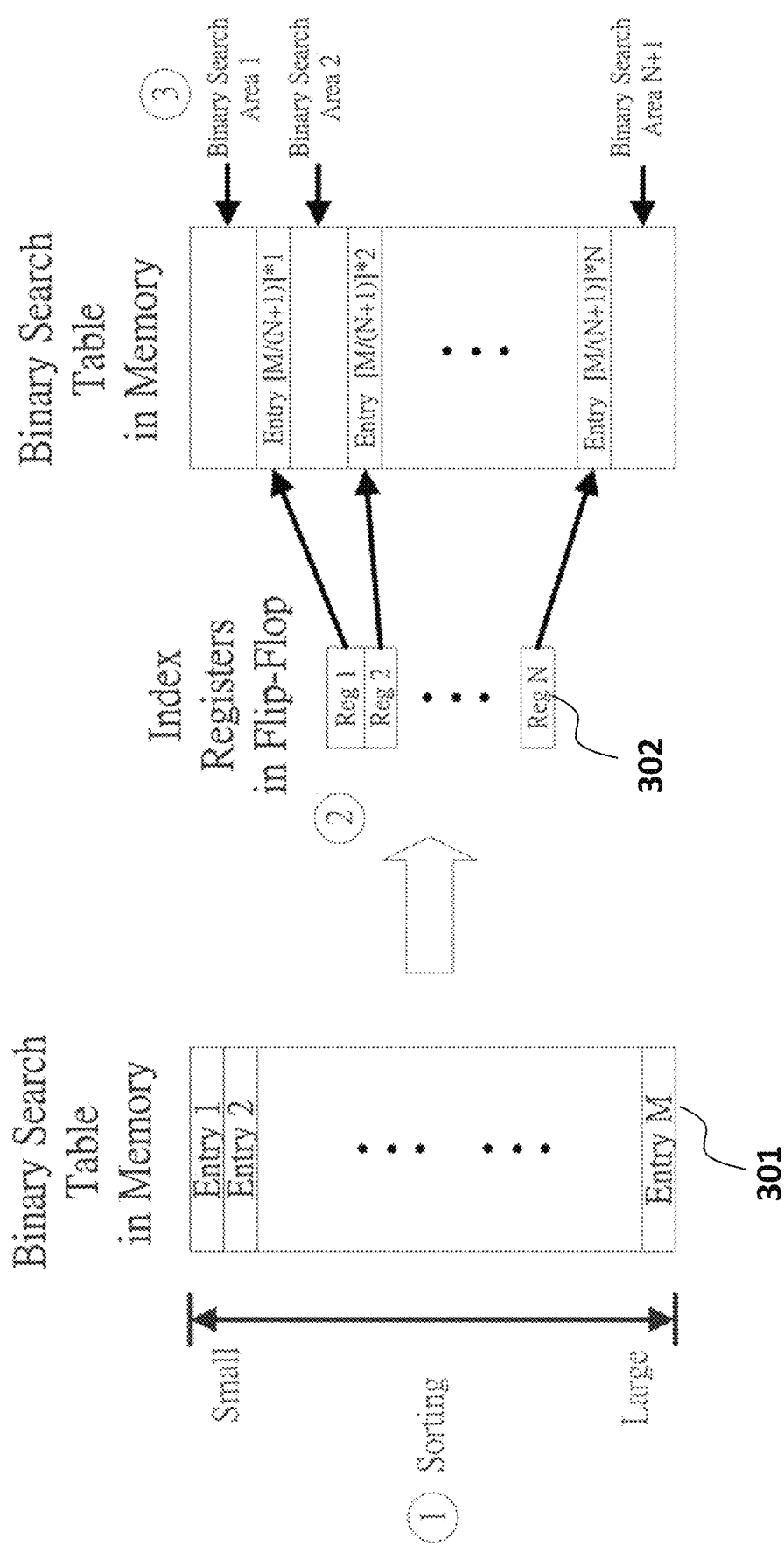
FIG. 3 provides a general illustration of the improved binary search method of the present invention.

Reference is next made to FIG. 3, which provides a general illustration of the improved binary search method of the present invention.

Assuming a memory 301 includes M entry, numbered as Entry 1, Entry 2 . . . to Entry M. Each entry has a value stored in, and all the values are sorted in an order from small to large. The sorting can be done by the assistance of software, and since relevant technologies of sorting are considered as conventional in the field, relevant descriptions will be omitted for convenience.

The sorting may be modified accordingly. That is to say, each value may be sorted in order from large to small, and the present invention can still apply.

Referring once again to FIG. 3, an index register 302 is provided. The index register 302 includes N areas, numbered as Reg 1, Reg 2 . . . to Reg N. The N areas partition the binary search table into N+1 binary search areas, labeled as Binary Search Area 1, Binary Search Area 2 . . . to Binary Search Area N+1.

Applying the steps as described, the improved binary search of the present invention can further cut down the resources for computation.

Accordingly, the table entries are sorted by software. While setting the content of a hardware binary search table in memory with M entries, the software also sets additional N index registers (N<M) each of which contains the same value of the ($[M/(N+1)]*K$)'th table entry respectively, where K ranges from 1 to N.

It should be noted that, the N areas are extracted from the addresses of the memory. For example, in FIG. 2A, the index register 202 has four areas, each is extracted from address #0, address #5, address #10 and address #15.

It should be further noted that, if the first and the last address of a memory are all extracted, the partitioned search areas will be down to N−1. If one of the first and the last address of a memory is extracted, the partitioned search areas will be N. And if none of the first and last address of a memory is extracted, the partitioned search areas will be N+1.

With the information stored in the index registers, the target binary search area in memory is significantly reduced and the size of search area is fixed no matter how large the table size is. The maximum binary search response time is $\log_2((M-N)/(N+1))$.

In sum, for the present invention, it can be further understood that, with software's assistance, the maximum response time of binary search of the present invention over memory can be fixed no matter how large the hardware table size is.

In sum, one of the purposes of the present invention is that, the present invention controls the maximum response time of binary search to fit the performance requirement.

Further, the present invention can be applied in various environments, such as all hardware binary search table designs that, no matter how large the table size is, require limited maximum response time.

In sum, according to the present invention, table entry sorting and insertion are processed by software. This design reduces hardware complexity.

Further, with appropriate amount of index registers being added, the maximum binary search response time can be controlled to satisfy the performance requirement. The high-cost BCAM is not necessarily needed as a solution.

In sum, the present invention has certain potential applications and markets. For example, for all hardware binary search table designs that, no matter how large the table size is, require limited maximum response time.

In sum, the present invention provides a scalable hardware binary search design with constant maximum response time, in which table entry sorting and insertion are processed by software. Further, appropriate amount of index registers are added to record the contents of some table entries whose locations divide the table equally. With index registers, the target binary search area is just a fraction of the table and the area size is kept constant while the whole table size increases.

The invention claimed is:

1. A method for binary search, comprising:
providing a memory device with M entries, each entry storing a value; and
providing an index register including N register blocks, wherein the N register blocks partition the memory device into N−1, N or N+1 search areas;
wherein M and N are integers and N<M;
wherein when a target value is being searched in the memory device, the target value is determined to be fall between two adjacent register blocks, and only the addresses of the memory device in between the two register blocks are left for search.

2. The method for performing a binary search according to claim 1, wherein the register blocks are extracted from the M entries of the memory device.

3. The method for performing a binary search according to claim 1, wherein the values stored in the memory device are sorted in order from small to large.

4. The method for performing a binary search according to claim 1, wherein the values stored in the memory device are sorted in order from large to small.

5. The method for performing a binary search according to claim 2, wherein the sorting is performed by a software.

6. A system for performing a binary search, comprising:
a memory device, the memory device includes M entries, and each entry stores a value; and
an index register, the index register includes N register blocks, and the N register blocks partition the memory device into N−1, N or N+1 search areas;
wherein M and N are integers and N<M;
wherein when a target value is being searched in the memory, the target value is determined to be fall between two adjacent register blocks, and only the addresses of the memory in between the two register blocks are left for search.

7. The system for performing a binary search according to claim 6, wherein the register blocks are extracted from the M entries of the memory device.

8. The system for performing a binary search according to claim 6, wherein the values stored in the memory device are sorted in order from small to large.

9. The system for performing a binary search according to claim 6, wherein the values stored in the memory device are sorted in order from large to small.

10. The system for performing a binary search according to claim 7, wherein the sorting is performed by a software.

* * * * *